(12) United States Patent
Meier

(10) Patent No.: US 7,808,785 B2
(45) Date of Patent: Oct. 5, 2010

(54) SEMICONDUCTOR MODULE

(75) Inventor: Markus Meier, Rieden (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/081,157

(22) Filed: Apr. 11, 2008

(65) Prior Publication Data

US 2008/0253089 A1 Oct. 16, 2008

(30) Foreign Application Priority Data

Apr. 12, 2007 (EP) .................................. 07007557

(51) Int. Cl.
*H05K 7/20* (2006.01)
(52) U.S. Cl. .................. 361/704; 361/679.54; 361/710; 361/715; 361/717; 361/719; 165/80.3; 165/185; 257/714; 257/718; 257/722
(58) Field of Classification Search ................. 361/679, 361/688, 689, 702–712, 714, 717–722; 257/706–727; 165/80.2–80.5, 104.33, 185; 174/15.1, 16.3, 174/252
See application file for complete search history.

(56) References Cited

U.S. PATENT DOCUMENTS

| | | | | |
|---|---|---|---|---|
| 4,381,032 A * | 4/1983 | Cutchaw | ..................... | 165/46 |
| 4,459,976 A * | 7/1984 | Speros | ....................... | 126/674 |
| 4,769,744 A * | 9/1988 | Neugebauer et al. | ........ | 361/717 |
| 4,770,242 A * | 9/1988 | Daikoku et al. | ............. | 165/185 |
| 4,800,956 A * | 1/1989 | Hamburgen | .................. | 165/185 |
| 5,014,117 A | 5/1991 | Horvath et al. | | |
| 5,052,481 A * | 10/1991 | Horvath et al. | .............. | 165/185 |
| 5,109,317 A * | 4/1992 | Miyamoto et al. | .......... | 361/715 |
| 5,201,866 A * | 4/1993 | Mok | ......................... | 165/80.3 |
| 5,272,967 A * | 12/1993 | Held | .......................... | 100/311 |
| 5,287,001 A * | 2/1994 | Buchmann et al. | .......... | 257/719 |
| 5,552,961 A * | 9/1996 | Van Gaal et al. | ............ | 361/700 |
| 5,705,850 A * | 1/1998 | Ashiwake et al. | ........... | 257/714 |
| 5,751,062 A * | 5/1998 | Daikoku et al. | ............. | 257/722 |
| 5,774,334 A * | 6/1998 | Kawamura et al. | .......... | 361/699 |
| 5,808,868 A | 9/1998 | Drekmeier | | |
| 5,910,884 A * | 6/1999 | Garza et al. | ................. | 361/690 |
| 6,324,057 B1 * | 11/2001 | Baran et al. | ................. | 361/690 |
| 6,343,643 B1 * | 2/2002 | Bollesen | .................... | 165/80.3 |
| 6,381,844 B1 * | 5/2002 | Bollesen | ................... | 29/890.03 |
| 6,988,533 B2 * | 1/2006 | Colbert et al. | ............. | 165/80.3 |

(Continued)

FOREIGN PATENT DOCUMENTS

| EP | 0 020 911 A2 | 1/1981 |
|---|---|---|
| EP | 0 061 592 A2 | 3/1982 |

OTHER PUBLICATIONS

European Office Action, Apr. 6, 2009.

(Continued)

*Primary Examiner*—Michael V Datskovskiy
(74) *Attorney, Agent, or Firm*—Harness, Dickey & Pierce, P.L.C.

(57) ABSTRACT

A semiconductor module has a housing, including a power semiconductor, a cooler bearing against the latter and serving for dissipating heat loss. In at least one embodiment, a spring element, which is supported between housing and cooler, is arranged on the side of the cooler remote from the power semiconductor and prestresses the cooler against the power semiconductor.

17 Claims, 2 Drawing Sheets

U.S. PATENT DOCUMENTS

| | | | | |
|---|---|---|---|---|
| 6,999,317 | B2 * | 2/2006 | Chengalva et al. | 361/715 |
| 7,034,395 | B2 * | 4/2006 | Stolze | 257/718 |
| 7,277,291 | B2 * | 10/2007 | Ross et al. | 361/710 |
| 7,291,914 | B2 * | 11/2007 | Stolze | 257/719 |
| 7,646,612 | B2 * | 1/2010 | Duarte et al. | 361/799 |
| 2005/0230820 | A1 * | 10/2005 | Licht | 257/720 |

OTHER PUBLICATIONS

Hassan, Oktay, Ostergren, Paivanas; High performance chip-cooling technique for cold plate or external air-cooled modules; IBM Technical Disclosure Bulletin; Others.

European Search Report.

* cited by examiner

SEMICONDUCTOR MODULE

PRIORITY STATEMENT

The present application hereby claims priority under 35 U.S.C. §119 on European patent application number EP07007557 filed Apr. 12, 2007, the entire contents of which is hereby incorporated herein by reference.

FIELD

Embodiments of the present application generally relate to a semiconductor module.

BACKGROUND

Power semiconductors are used nowadays in many areas of technology, e.g. industrial automation technology. In order that the corresponding power semiconductors or the circuits realized with them are made manipulable, they are generally integrated into a housing, e.g. composed of plastic. Arrangements of this type are referred to as semiconductor modules and are e.g. contactors, motor starters or the like. During operation, power semiconductors cause heat losses that can lead to their continuous heating and—if the heat that arises is not dissipated—to their destruction. The heat loss is generally dissipated preferably by way of an air cooling system or else by means of a water cooling system which is coupled to the power semiconductor. For heat dissipation, corresponding cooling systems have to be pressed as well as possible on to the power semiconductor or a part that is thermally coupled thereto. One location of this type is generally the carrier layer, e.g. a printed circuit board composed of ceramic (DCB—direct copper bonding).

In the case of large quantities of heat to be dissipated, e.g. in converters, it is known for the power semiconductor and the cooler to be screwed to one another. By way of example, the generally quadrangular printed circuit board is screwed by means of a screw at each corner on a heat sink. In this case, as a result of the screws being tightened nonuniformly, a tilting can be brought about between cooler and power semiconductor, which can lead e.g. to fracture of the printed circuit board. Moreover, screws can be forgotten or tightened incorrectly or not at all. A final inspection of a correctly tightened screw during the manufacture of a semiconductor module is extremely costly. As a result of the settling of the screw head on its support, e.g. a plastic housing of a semiconductor module, a loss of prestress can occur over time and the contact pressure between cooler and printed circuit board can become impermissibly low. Moreover, screwing together cooler and power semiconductor necessitates drilling or thread cutting in cooler and printed circuit board.

For lower-power semiconductors, e.g. in the case of microprocessors in PCs, it is also known to clamp a cooler on to the semiconductor by means of clamping springs. The corresponding clamping springs may be forgotten during mounting. For the clamping springs to engage, corresponding receptacles at which clamping clips or the like find a hold are generally necessary both on the cooler and on the semiconductor or semiconductor module. This requires an additional manufacturing step during their production.

SUMMARY

In at least one embodiment of the present invention, a semiconductor module is specified with improved contact pressing of cooler and power semiconductor.

In at least one embodiment a semiconductor module includes a housing, wherein a power semiconductor and a cooler are contained in the housing. The cooler bears against a cooling surface, which is thermally coupled to the power semiconductor, and serves for dissipating the heat loss thereof via the cooling surface. The cooling surface can, of course, also be the power semiconductor itself; it is rarely the case, however, since the power semiconductor—as explained above—is generally arranged on a carrying structure, e.g. a printed circuit board, which then has the cooling surface.

According to at least one embodiment of the invention, in the semiconductor module a spring element is provided which is supported between housing and cooler, is arranged on that side of the cooler which is remote from the cooling surface, and prestresses the cooler against the cooling surface.

In the semiconductor module according to at least one embodiment of the invention, therefore, the pressing of the cooler on to the cooling surface and thus the power part or the power semiconductor is achieved by way of a spring element which is supported alongside the cooler not on the power semiconductor but rather on the housing. In this case, the support of the spring element on the housing or on the cooler does not have to be over the whole area. The cooler is consequently pressed against the cooling surface by means of the housing of the semiconductor module. Consequently, the housing absorbs the prestress force between cooler and power semiconductor. Since the spring element between cooler and housing is generally supported by clamping, mechanical processing of the cooler is not necessary. Coolers are generally produced by the extrusion method and sawn to the corresponding length. That side of the cooler which is remote from the power semiconductor is thus generally planar. Since the spring element is generally supported on this planar side, no further processing is necessary there.

The process for assembling the semiconductor module is simplified since no screwing operation or connection by way of spring clips is necessary. Screws or spring clips cannot be forgotten.

During the assembly of the semiconductor module, the spring element is generally inserted into the housing and then pressed or clamped in between housing and cooler by assembly of the rest of the housing. This simple assembly results in a low risk of faults. The rapid assembly and the saving of individual parts such as screws or spring clips result in a saving of costs. The assembly of a housing with inserted spring element can generally be effected in translational fashion, thereby avoiding tilting between cooler and power semiconductor.

The number of parts in the semiconductor module is reduced and the abovementioned loss of prestress of screws is avoided, particularly if the spring element bears against the housing or cooler over a large area. A simple quality control after assembly of the semiconductor module is possible since it is limited to the presence of the spring element, which, if it has been inserted then, that is to say is present, given a suitable configuration—e.g. in plate or disk form—cannot be inserted incorrectly.

In this case, in a first embodiment of the invention, the spring element can be formed as a separate component. Suitable spring elements can then be stocked or replaced.

The spring element can be a spring, in particular a spiral or leaf spring. Spring elements of this type are available cost-effectively as mass-produced products.

The spring element can be an elastomer element. High press-on forces, e.g. comparable with a quadruple screw joint, can be achieved by corresponding selection and configuration of an elastomer part. Moreover, the elasticity of the elastomer makes it possible to compensate for large geometrical tolerances of the semiconductor module in conjunction with, nevertheless, a sufficient contact pressure.

The elastomer element can be configured in plate form. As a result, it bears particularly well against cooler or housing.

In a second alternative embodiment of the invention, the spring element can also be formed integrally with the housing. In this case, the spring element can e.g. be integrated in the housing by casting in if this is intrinsically a prefabricated separate part, such as e.g. a spring. However, the spring element can also be integrally formed directly on to the housing.

The spring element can be an elastic partial structure of the housing. Thus, there may be present e.g. on the housing knobs, protrusions or shaped portions facing toward the inside of the housing, that is to say toward the cooler. The spring property of the spring element or the pressing of the cooler on to the cooling surface can then be provided by the elasticity of the housing material and the e.g. geometrical configuration of the corresponding integrally formed portions.

The housing can have a latching device for the assembly of the semiconductor module under prestress of the spring element. The spring element is then e.g. inserted into the housing, the cooler is placed thereon and after, for the assembly of the semiconductor module, the power module or a corresponding second housing part is pressed onto the housing to an extent such that the corresponding prestress arises with compression of the spring element, the latching device latching in place only in the prestressed state.

A corresponding latching can be achieved by manual assembly of the housing or pressing by way of a pressing device for higher contact pressures.

The latching device can also engage into a partial structure carrying the power semiconductor or a part of the semiconductor module. A partial structure of this type is e.g. a preassembled power part comprising the semiconductor, the printed circuit board and a housing (upper) part. The latching device can also engage into the carrying structure, e.g. printed circuit board, or directly into the power semiconductor.

The housing can also have a screw joint for assembly of the semiconductor module with prestress of the spring element. The screw joint then replaces or supplements the abovementioned latching in the same mode of operation.

BRIEF DESCRIPTION OF THE DRAWINGS

For a further description of the invention, reference is made to the example embodiments in the drawings, in which in each case in a schematic basic diagram.

DETAILED DESCRIPTION OF THE EXAMPLE EMBODIMENTS

Figure 1:
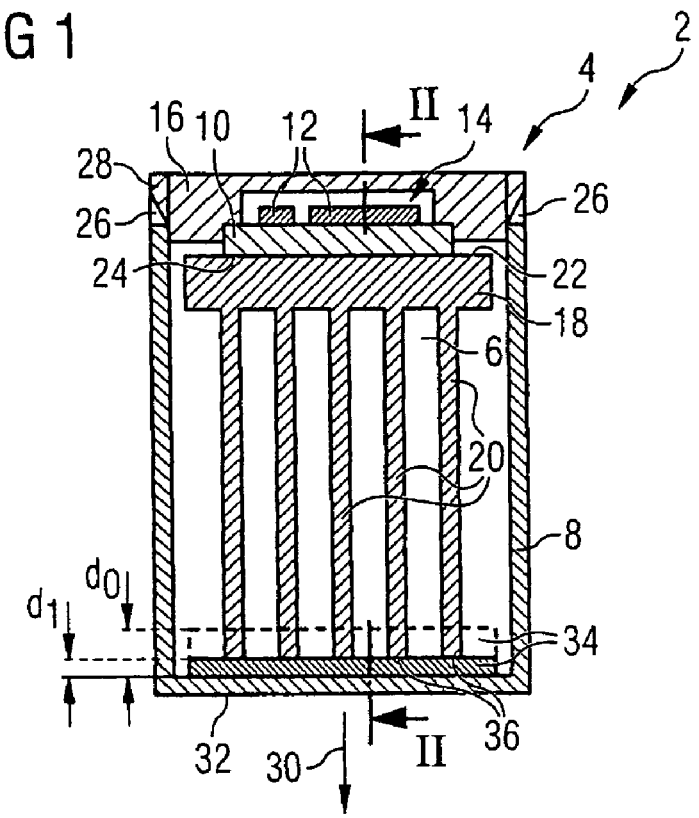
FIG. 1 shows a semiconductor module in cross section with an elastomer element as spring element.

Various example embodiments will now be described more fully with reference to the accompanying drawings in which only some example embodiments are shown. Specific structural and functional details disclosed herein are merely representative for purposes of describing example embodiments.

The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

FIG. 1 shows a semiconductor module 2, including a power part 4, a cooler 6 and a cooler housing 8. A printed circuit board 10 together with power semiconductors 12 mounted thereon forms the actual power semiconductor circuit 14. The circuit 14 is connected to a housing upper part 16, in the example by way of a snap-action connection (not illustrated), in order together with this to form the power part 4.

The cooler 6 includes a cooler plate 18 and fins 20 integrally formed thereon. By its top side 22, the cooler plate 18 bears against the underside 24 of the printed circuit board 10, which represents the cooling surface for the power semiconductors 12. Thermally conductive paste (not illustrated) is introduced between the two. Heat loss from the semiconductor 12 is therefore conveyed via the printed circuit board 10 to the cooler plate 18 and to the cooling fins 20, through which cooling air flows. Between cooler 6 and cooler housing 8, an elastomer plate 34 is pressed on the base 32 of the housing.

The cooler housing 8 essentially has the form of a parallelepiped open toward the top, that is to say toward the power part 4, that is to say is U-shaped in the cross section shown in FIG. 1. The cooler housing 8 has a plurality of cutouts 26 serving for engagement with latching lugs 28 which are in turn integrally formed on the housing upper part 16.

FIG. 1 shows the semiconductor module 2 in the finished assembled state. The following procedure is adopted during assembly: Firstly, in the direction of the arrow 30, an elastomer plate 32 is inserted into the as yet empty cooler housing 8 on to the inner side of the base 32. Afterward, the cooler 6 with the cooling fins 20 ahead is inserted into the cooler housing 8 likewise in the direction of the arrow 30. Afterward, the top side 22 is coated with thermally conductive paste and the preassembled housing upper part 16 with the underside 24 of the printed circuit board 10 ahead is placed onto the cooler 6. The elastomer plate 34 is as yet uncompressed and has the thickness $d_0$. In the current situation, the latching lugs 28 cannot yet be brought into engagement with the cutouts 26 since the housing upper part 16 still projects from the cooler housing 8 counter to the direction of the arrow 30. By applying a force in the direction of the arrow 30 onto the housing upper part 16, the power part 4 together with the cooler 6 is then pressed in the direction of the base 32 and the elastomer plate 34 is compressed in the process, such that its thickness decreases from the initial value $d_0$ to the compressed thickness $d_1$ by a displacement $s=d_0-d_1$. The latching lugs 28 then latch into the cutouts 26.

The elastomer part is now supported between base 32 and cooling fins 20 or the underside 36 thereof and generates respective press-on forces there which also act in each case between cooler 6, printed circuit board 10, housing upper part 16 or latching lugs 28 and cooler housing 8 or cutout 26. By this, therefore, in particular the cooler plate 18 is prestressed against the printed circuit board 10 on the cooling surface.

Figure 3:
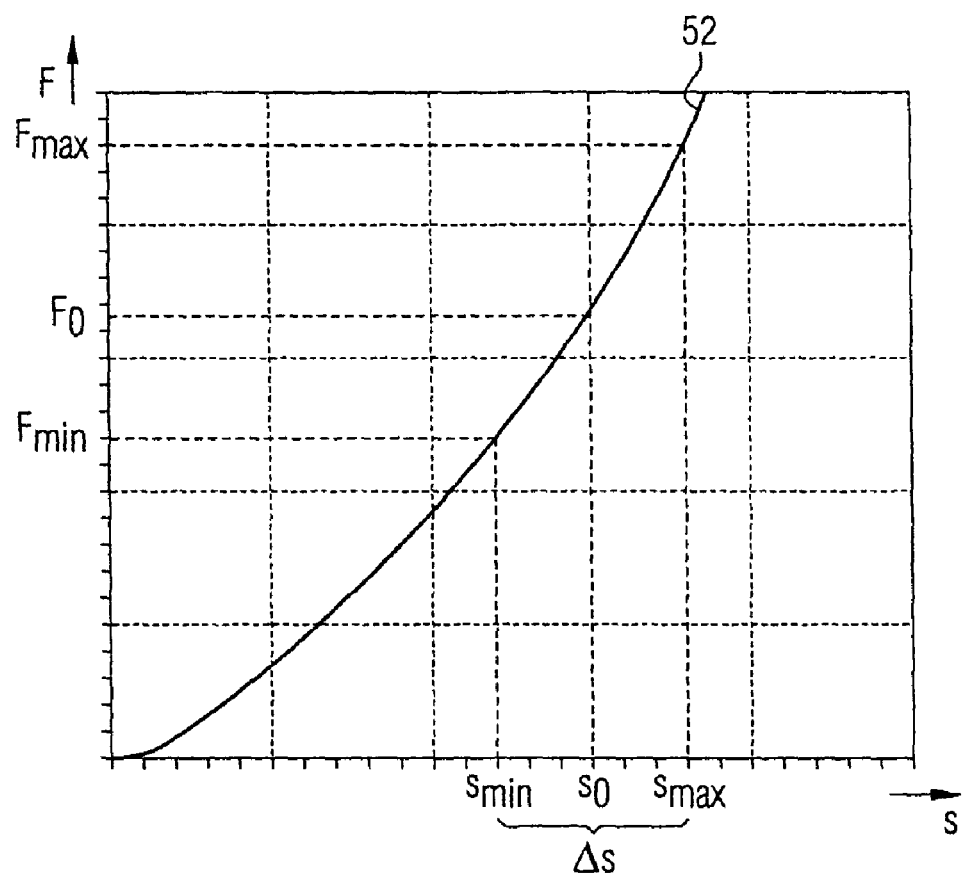
FIG. 3 shows a force-displacement diagram for the elastomer element in FIG. 1.

FIG. 3 shows a curve 52 in a force-displacement diagram by way of example for the elastomer plate 34. The compression displacement s, that is to say the difference between $d_0$ and $d_1$ from FIG. 1, is plotted on the abscissa and the force F supplied back by the elastomer plate 34 is plotted on the ordinate.

The geometrical dimensioning of the semiconductor module 2 is embodied in such a way that in the finished assembled state in accordance with FIG. 1, the elastomer plate is compressed by $s_0$ with respect to the initial thickness $d_0$. This results in a press-on force of $F_0$ between the cooler plate 18 and the printed circuit board 10, which ensures sufficient thermal conduction. The entire component tolerances in the semiconductor module 2 are designed in such a way that in one extreme case, the elastomer plate 34 is still compressed by $s_{min}$ proceeding from the thickness $d_0$. The minimum press-on force therefore turns out to be $F_{min}$, in FIG. 3. In the case of the opposite maximum tolerance situation, a compression of the elastomer plate 34 by $s_{max}$ results, which leads to a press-on force of $F_{max}$. The elastomer plate 34 can therefore compensate for geometrical tolerances $\Delta s$ within a wide range of $\Delta s=s_{max}-s_{min}$ without in the process bringing about an impermissibly low or high contact pressure in the semiconductor module 2.

Figure 2:
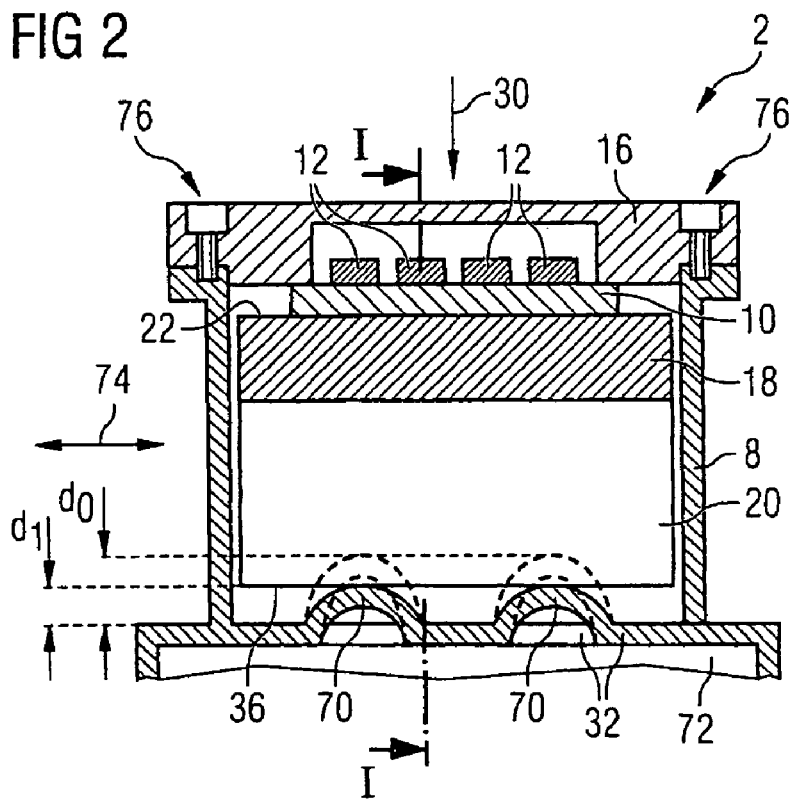
FIG. 2 shows a semiconductor module in accordance with FIG. 1 in an alternative embodiment with press-on contour integrally formed onto the housing.

FIG. 2 shows an alternative embodiment of a semiconductor module 2 which is otherwise structurally identical to FIG. 1. FIG. 2 shows a section along the line II-II from FIG. 1, FIG. 1 showing a section along the line I-I through FIG. 2. FIG. 2 therefore also reveals the mounting structure 72 integrally formed on the cooler housing 8, said mounting structure serving for fixing the semiconductor module 2 e.g. in a switchgear cabinet. The elastomer plate 34 from FIG. 1 is replaced in FIG. 2 by protrusions 70 in the base 32 of the cooler housing 8, the protrusions being directed toward the interior of the cooler housing 8. In this case, the protrusions 70 are introduced into the cooler housing 8 by cutting free and deforming the material of the cooler housing 8, e.g. plastic, and are compressively elastic in the direction of the arrow 30. Therefore, the spring element according to an embodiment of the invention is in this case embodied integrally with the cooler housing 8.

The protrusions 70 are in each case supported at a plurality of locations over the length of a cooling fin 20. Through corresponding geometrical configuration of the protrusions 70 or a material selection of the cooler housing 8, a force-displacement characteristic curve corresponding to that with regard to the curve 52 from FIG. 3 can be realized for said protrusions. FIG. 2 also reveals that the cooler 6 is cut from an extruded profile extending in the direction of the arrow 74. The top side 22 and underside 36 are therefore planar in the direction of the arrow 74 as early as production.

In FIG. 2, in contrast to FIG. 1, moreover, the latching comprising latching lugs 28 and cutouts 26 is replaced by a screw joint 76 (not explained in greater detail), which presses the housing upper part 16 down against a cooler housing 8 in the direction of the arrow 30 and thus compresses the protrusions 70 to the thickness $d_1$.

Further, elements and/or features of different example embodiments may be combined with each other and/or substituted for each other within the scope of this disclosure and appended claims.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A semiconductor module with a housing, comprising:
a power semiconductor;
a substrate including a cooling surface;
a one-piece cooler including a plurality of fins, bearing against the cooling surface, the cooling surface arranged between the one-piece cooler and the power semiconductor, the one-piece cooler thermally coupled to the power semiconductor, and serving to dissipate heat loss; and
a spring element arranged on a side of the cooler remote from the cooling surface to prestress the cooler against the cooling surface.

2. The semiconductor module as claimed in claim 1, wherein the spring element is arranged adjacent to the housing and the cooler.

3. The semiconductor module as claimed in claim 1, wherein the spring element is an element made of elastomer.

4. The semiconductor module as claimed in claim 3, wherein the elastomer element is in plate form.

5. The semiconductor module as claimed in claim 1, wherein the spring element is one of attached to the housing and a part of the housing.

6. The semiconductor module as claimed in claim 5, wherein the spring element is a part of the housing.

7. The semiconductor module as claimed in claim 6, wherein the spring element is a protrusion of the housing that is directed toward the cooler.

8. The semiconductor module as claimed in claim 1, wherein the housing includes a latching device for the assembly of the semiconductor module under prestress of the spring element.

9. The semiconductor module as claimed in claim 8, wherein the power semiconductor is connected to a part of the semiconductor module.
  the latching device engages on the part of the semiconductor module.

10. The semiconductor module as claimed in claim 1, wherein the housing includes a screw joint for the assembly of the semiconductor module under prestress of the spring element.

11. The semiconductor module as claimed in claim 2, wherein the spring element is an element made of elastomer.

12. The semiconductor module as claimed in claim 2, wherein the housing includes a latching device for the assembly of the semiconductor module under prestress of the spring element.

13. The semiconductor module as claimed in claim 12, wherein the power semiconductor is connected to a part of the semiconductor module, and
  the latching device engages on the part of the semiconductor module.

14. The semiconductor module as claimed in claim 2, wherein the housing includes a screw joint for the assembly of the semiconductor module under prestress of the spring element.

15. A semiconductor module with a housing, comprising:
a power semiconductor;
a substrate including a cooling surface;
a one-piece cooler including a plurality of fins, bearing against the cooling surface, the cooling surface arranged between the one-piece cooler and the power semiconductor, the one-piece cooler thermally coupled to the power semiconductor, and serving to dissipate heat loss; and
a spring element, supported between the housing and the cooler, arranged on a side of the cooler remote from the cooling surface to prestress the cooler against the cooling surface.

16. The semiconductor module as claimed in claim 1, wherein no object is in contact with a top surface of the power semiconductor.

17. The semiconductor module as claimed in claim 1, wherein the spring element is between the housing and an end of at least one of the plurality of fins.

* * * * *